(12) United States Patent
Pandini

(10) Patent No.: US 10,009,025 B2
(45) Date of Patent: Jun. 26, 2018

(54) DETECTION SENSOR

(71) Applicant: S.T.S.R. S.R.L., Lacchiarella (IT)

(72) Inventor: Fabio Pandini, San Genesio ed Uniti (IT)

(73) Assignee: S.T.S.R. S.R.L., Lacchiarella (MI) (IT)

( * ) Notice: Subject to any disclaimer, the term of this patent is extended or adjusted under 35 U.S.C. 154(b) by 36 days.

(21) Appl. No.: 15/313,507

(22) PCT Filed: May 15, 2015

(86) PCT No.: PCT/IB2015/053596
§ 371 (c)(1),
(2) Date: Nov. 22, 2016

(87) PCT Pub. No.: WO2015/177697
PCT Pub. Date: Nov. 26, 2015

(65) Prior Publication Data
US 2017/0104485 A1 Apr. 13, 2017

(30) Foreign Application Priority Data
May 22, 2014 (IT) .................................. MI14A0944

(51) Int. Cl.
| H03K 17/955 | (2006.01) |
| H03K 17/96 | (2006.01) |
| E03C 1/05 | (2006.01) |
| G05D 7/06 | (2006.01) |
| H01L 27/02 | (2006.01) |
| H03K 5/1532 | (2006.01) |

(52) U.S. Cl.
CPC ........... *H03K 17/955* (2013.01); *E03C 1/057* (2013.01); *H01L 27/0248* (2013.01);
(Continued)

(58) Field of Classification Search
CPC ......... E03C 1/057; G05D 7/06–7/0694; H03K 17/955; H03K 17/962
(Continued)

(56) References Cited

U.S. PATENT DOCUMENTS 4,839,039 A * 6/1989 Parsons ................ A47K 5/1217
137/551
5,148,107 A * 9/1992 Finger ................ G01R 27/2611
324/207.11
(Continued)

FOREIGN PATENT DOCUMENTS

| EP | 0463440 A2 | 1/1992 |
| EP | 2233650 A1 | 9/2010 |

OTHER PUBLICATIONS

International Search Report for PCT/IB2015/053596 dated Sep. 8, 2015.

*Primary Examiner* — Seth W Mackay-Smith
(74) *Attorney, Agent, or Firm* — Hedman & Costigan, P.C.; James V. Costigan; Kathleen A. Costigan

(57) ABSTRACT

The invention relates to a sensor (1) comprising a pulse generator (2) and an electrode (3) connected to an output of the pulse generator (2). A detector (61) detects a change in the amplitude of the signal being present at the electrode, and a control unit (62) operatively connected to the output of the detector (61), detects the presence of a person interacting with the sensor based on the output signal of the detector (61). Furthermore, the electrode (3) is connected to the pulse generator (2) via an inductive circuit such that the sensor can detect the presence of a user but can also be used as a touch sensor.

In one embodiment, the pulse generator (2) via an inductive circuit is adapted to generate a pulse train with repetition rate equal to the resonance frequency of the inductive circuit or to an integer multiple of an octave of said resonance frequency.

An automatic faucet (100) using such sensor is further described.

11 Claims, 9 Drawing Sheets

(52) U.S. Cl.
CPC ......... *H03K 5/1532* (2013.01); *H03K 17/962* (2013.01); *H03K 2017/9606* (2013.01); *H03K 2217/96073* (2013.01)

(58) Field of Classification Search
USPC ........ 251/129.04, 129.05; 324/633, 654–656
See application file for complete search history.

(56) References Cited

U.S. PATENT DOCUMENTS

| | | | | |
|---|---|---|---|---|
| 5,694,653 | A * | 12/1997 | Harald | E03C 1/057 4/559 |
| 5,963,135 | A * | 10/1999 | Van Marcke | G01S 7/484 137/1 |
| 5,966,753 | A * | 10/1999 | Gauthier | A47K 5/12 4/623 |
| 6,215,116 | B1 * | 4/2001 | Van Marcke | E03C 1/057 250/214 A |
| 8,376,313 | B2 * | 2/2013 | Burke | E03C 1/057 251/129.04 |
| 8,432,169 | B2 * | 4/2013 | Niwa | H03K 17/9547 324/652 |
| 8,766,649 | B1 * | 7/2014 | Lumbab | G01B 7/023 324/654 |
| 2013/0277351 | A1 * | 10/2013 | Lamesch | B60N 2/002 219/202 |
| 2014/0002111 | A1 * | 1/2014 | Potyrailo | H05K 1/16 324/655 |

\* cited by examiner

DETECTION SENSOR

TECHNICAL FIELD

The present invention relates to the field of detection sensors, particularly the field of sensors to be installed within environments rich in moisture or water.

The invention is preferably and advantageously applied to the field of automatic faucets, where the control of the water flow occurs by means of touch or proximity sensors.

The invention is also applied to the security field, where touch and proximity sensors are installed within metal frames or conductive films applied to windows, grates or gates that can be exposed to bad weather.

Particularly the invention relates to a sensor according to the preamble of claim 1 and to an automatic faucet incorporating such sensor.

PRIOR ART

Automatic faucets have become quite common for several reasons.

First of all they allow water to be saved, since when the person washing his/her hands moves away from the faucet, this latter stops water flowing. Secondly they are hygienic since water can be controlled without (or almost without) touching the faucet handles with dirty hands.

Currently there are several types of automatic faucets, mainly based on a capacitive or infrared (IR) sensor.

The faucets with infrared sensor have the advantage that no contact with the faucet is necessary to turn on and off the water flow, however they have the drawback of being uncomfortable when the basin of the sink underneath is desired to be filled, for example for washing clothes. In this case it would be necessary to remain with the hands near the sensor for all the time necessary to fill the sink, without the possibility of going away.

In order to solve this type of drawbacks, the U.S. Pat. No. 8,376,313 provides a capacitive sensor for faucets that allows the water flow to be turned on and off by a simple touch of the hand on an electrode of the sensor.

Although it is efficient, the solution known from U.S. Pat. No. 8,376,313 however has some drawbacks, such as the need of a ground or virtual ground connection. Moreover the U.S. Pat. No. 8,376,313 seems not to provide the possibility of complicated controls on the faucet, but it can only turn on or off the water flow depending on a capacitance change detected on the sensor.

On the contrary from the U.S. Pat. No. 5,694,653 a solution of an automatic faucet is known, that, as in the case of IR sensors, does not need touching the faucet. This solution allows not only the turning on and off of the water flow to be controlled, but also the water temperature to be adjusted by means of proximity sensors. However this solution is quite complicated and cumbersome. A plurality of transmitter antennas arranged on the basin of the sink or on the faucet spout emits an electrostatic field. A receiver antenna receives the electrostatic field generated by the human body once it comes in contact with the transmitted field. A processor processes the received signal for controlling the faucet accordingly.

OBJECTS AND SUMMARY OF THE INVENTION

It is the object of the present invention to overcome the prior art drawbacks related to the production of detection sensors.

Particularly it is an object of the present invention to provide a sensor of flexible use that can operate as a touch or proximity sensor.

These and other objects of the present invention are achieved by a sensor embodying the characteristics of the annexed claims, which are an integral part of the present description.

In one embodiment, the sensor comprises a pulse generator and an electrode connected to an output of the pulse generator by an inductive circuit, for example a real inductor. The sensor further comprises a detector for detecting a change in the amplitude of the signal present at the electrode, and a control unit operatively connected to the output of the detector and able to detect the presence of a person interacting with the sensor depending on the output signal from the detector.

The choice of connecting the electrode to the pulse generator by an inductive circuit allows the flexibility of use of the sensor to be improved. By changing the frequency of the generator it is possible to operate the sensor as a touch sensor or as a proximity sensor, or as a mixture of touch and proximity sensor.

This allows the sensor to be used in different applications. For example in the case of operation as a mixed sensor, this allows the sensor to be used for controlling multi-way faucets, such as showers, which are typically provided with at least two outlets, e.g. a spout of a faucet and a shower head.

Moreover the sensor does not need a ground or virtual ground, but it can operate with a ground line obtained on the same PCB (printed circuit board) where it is mounted.

In one embodiment, the sensor is provided with a pulse generator able to generate a pulse train with a repetition rate substantially equal to the resonance frequency of the inductive circuit or to an integer multiple of an octave of such resonance frequency.

The invention further relates to an automatic faucet using such sensor and to a method for controlling automatic faucets equipped with such sensor.

Further advantageous characteristics of the present invention will be more clear from the description below and from the annexed claims.

BRIEF DESCRIPTION OF THE DRAWINGS

The invention will be described below with reference to non-limiting examples, provided by way of example and not as a limitation in the annexed drawings. These drawings show different aspects and embodiments of the present invention and, where appropriate, reference numerals showing like structures, components, materials and/or elements in different figures are denoted by like reference numerals.

DETAILED DESCRIPTION OF THE INVENTION

While the invention is susceptible of various modifications and alternative forms, some non-limitative embodiments, provided for explanatory reasons, are described below in detail.

It should be understood, however, that there is no intention to limit the invention to the specific embodiments disclosed, but, on the contrary, the intention of the invention is to cover all modifications, alternative forms and equivalents falling within the scope of the invention as defined in the claims.

Therefore in the description below the use of "for example", "etc", "or" indicate non-exclusive alternatives without limitation unless otherwise defined; the use of "also" means "among which, but not limited to", unless otherwise defined; the use of "including/comprising" means "including/comprising, but not limited to," unless otherwise defined.

The term inductive circuit means a circuit having a mainly inductive equivalent impedance; therefore such a circuit for example will be a real inductor (well-known to comprise also minimum resistive capacitive components) or a real inductor with a series or parallel resistor.

Figure 1:
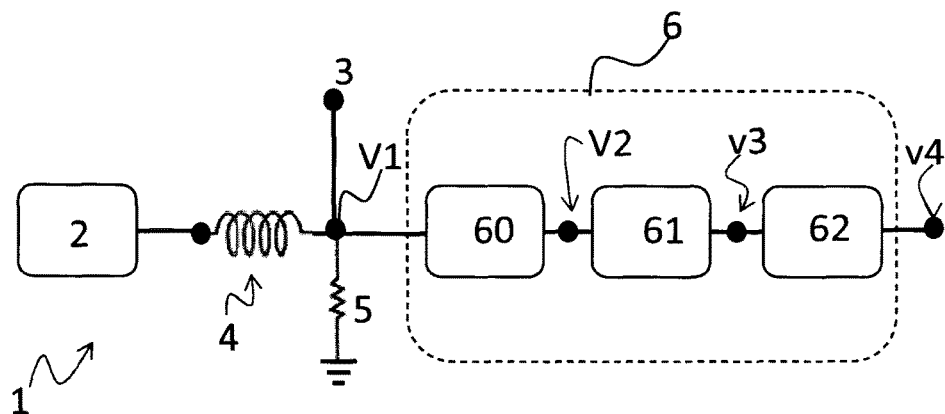
FIG. 1 schematically is a sensor according to the present invention.

FIG. 1 shows a sensor 1 intended to be installed within moist environments or in contact with water. In the examples below reference is made to the application on a sink (FIG. 5) without for this reason limiting the scope of protection and the possible applications of the sensor.

The sensor 1 comprises a pulse generator 2 able to generate a pulse train with a desired frequency, selectable within an operating range of the pulse generator 2. In a particularly advantageous embodiment, the pulse generator is configured for generating a square wave train with a repetition rate higher than 100 KHz, and preferably higher than 300 KHz. This frequency range is particularly advantageous for the sensor applied to automatic faucets, since it allows distinguishing one hand passing near the faucet (therefore with the intention of controlling it) from one hand passing far from the faucet (and therefore with no intention of controlling it).

The output of the pulse generator 2 is connected to an electrode 3 by an inductive circuit 4. A resistor 5 sets the polarization of the electrode 3 avoiding it remaining floating.

Downstream of the electrode, a detection and control circuit 6 detects the changes in the amplitude of the signal usually present at the electrode 3, which are due to a person interacting with the electrode. Thus, therefore, the detection and control circuit detects the presence of a person interacting with the electrode.

In the example of FIG. 1, the detection and control circuit 6 comprises:
- an amplifier 60 that amplifies the signal V1 corresponding to the one present at the electrode 3,
- a peak detector 61 that detects the maximum amplitude of the output signal V2 from the amplifier 60 and it provides an output constant signal V3 dependent from the amplitude of the output of the amplifier 60,
- a control unit 62 receives the input constant signal V3 and it generates an output control signal V4 that can be both a signal necessary to control one or more devices external to the sensor, such as one or more valves, such to control their turning on and off, and an alarm signal intended to be interpreted and managed by a microprocessor, external to the sensor, that in turn controls such external devices. Due to the above, the control unit 62 may not be provided inside the sensor and its functions may be carried out by a processor external to the sensor itself.

Figure 2:
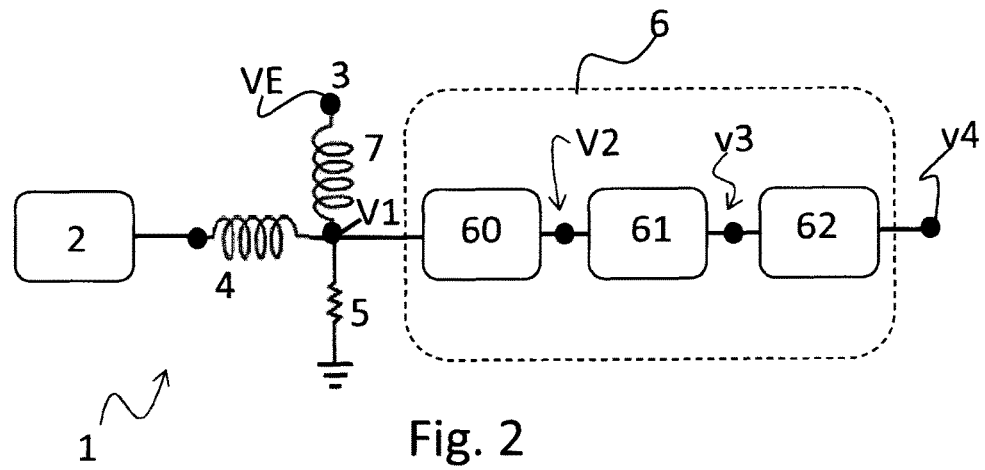
FIG. 2 is a first variant of the sensor of FIG. 1.

In the example of FIG. 2 one alternative embodiment of the sensor of FIG. 1 is shown. In this case, the electrode 3 is connected to the inductor 4 by a second inductor 7. When a person moves near or touches the electrode 3, then the signal VE present on the electrode changes and consequently also the voltage V1 actually detected by the detection and control circuit 6 changes. In this embodiment, therefore, the detection and control circuit 6 indirectly detects a change in the voltage present at the electrode 3.

Figure 3:
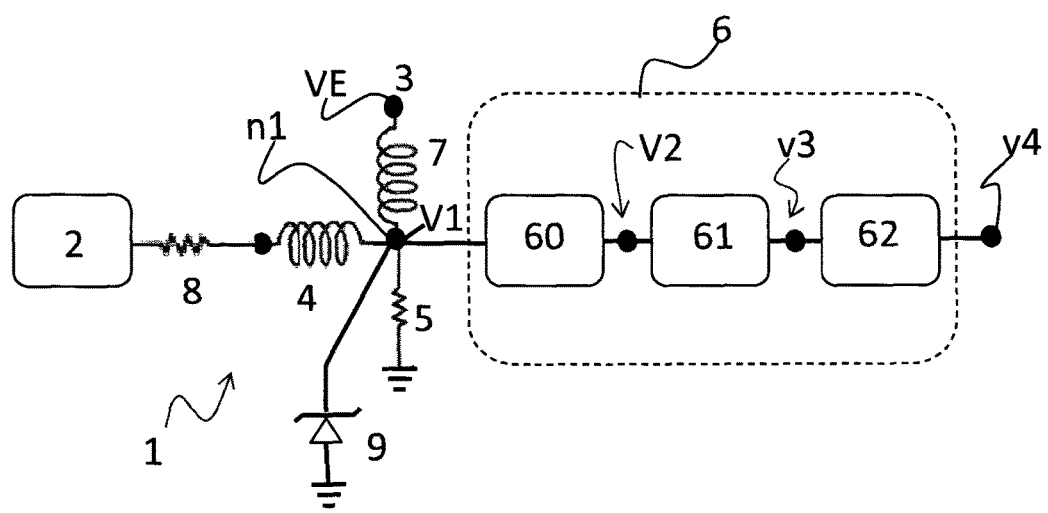
FIG. 3 is a second variant of the sensor of FIG. 1.

FIG. 3 shows a further embodiment of the sensor 1, wherein other components are inserted, such as a resistor 8 connected between the generator 2 and the inductor 4, and a Zener diode 9 that acts as ESD (Electrostatic Discharge) protection against electrostatic discharges.

Such additional components have been disclosed as possible elements that can be inserted within the sensor for improving its performances, even if they are not essential for implementing the function of detecting the interaction between the user and the electrode.

Figure 4:
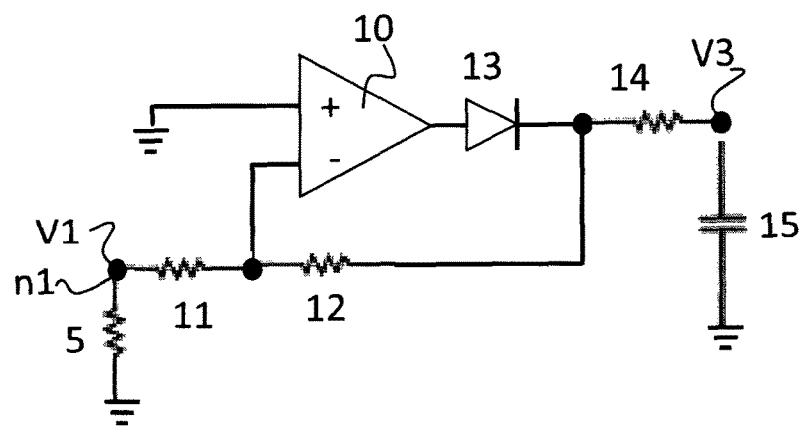
FIG. 4 is a circuit for implementing some components of the sensor of FIG. 1.

FIG. 4 shows a circuit that acts as amplifier and peak detector for the sensor; such circuit, therefore serves for implementing the functions of the circuit blocks 60 and 61 of FIGS. 1-3.

The circuit of FIG. 4 comprises an operational amplifier 10 whose non-inverting input is connected to ground and whose inverting input is connected between the resistor 11 and the resistor 12. The resistor 11 is connected to the node n1 where there is provided the monitored voltage V1, while the resistor 12 is connected on one side to the resistor 11 and on the other side to the output of the diode 13 situated on the output of the amplifier 10.

The RC circuit composed of the resistor 14 and of the capacitor 15 is a low-pass filter that allows an output voltage V3 to be provided that is a direct voltage with value $\alpha V1$, with $\alpha$ (alpha) being the gain of the circuit of FIG. 4.

Operatively, the sensor 1 is mounted on an automatic faucet such to detect the interaction between a person and the faucet.

Figure 5:
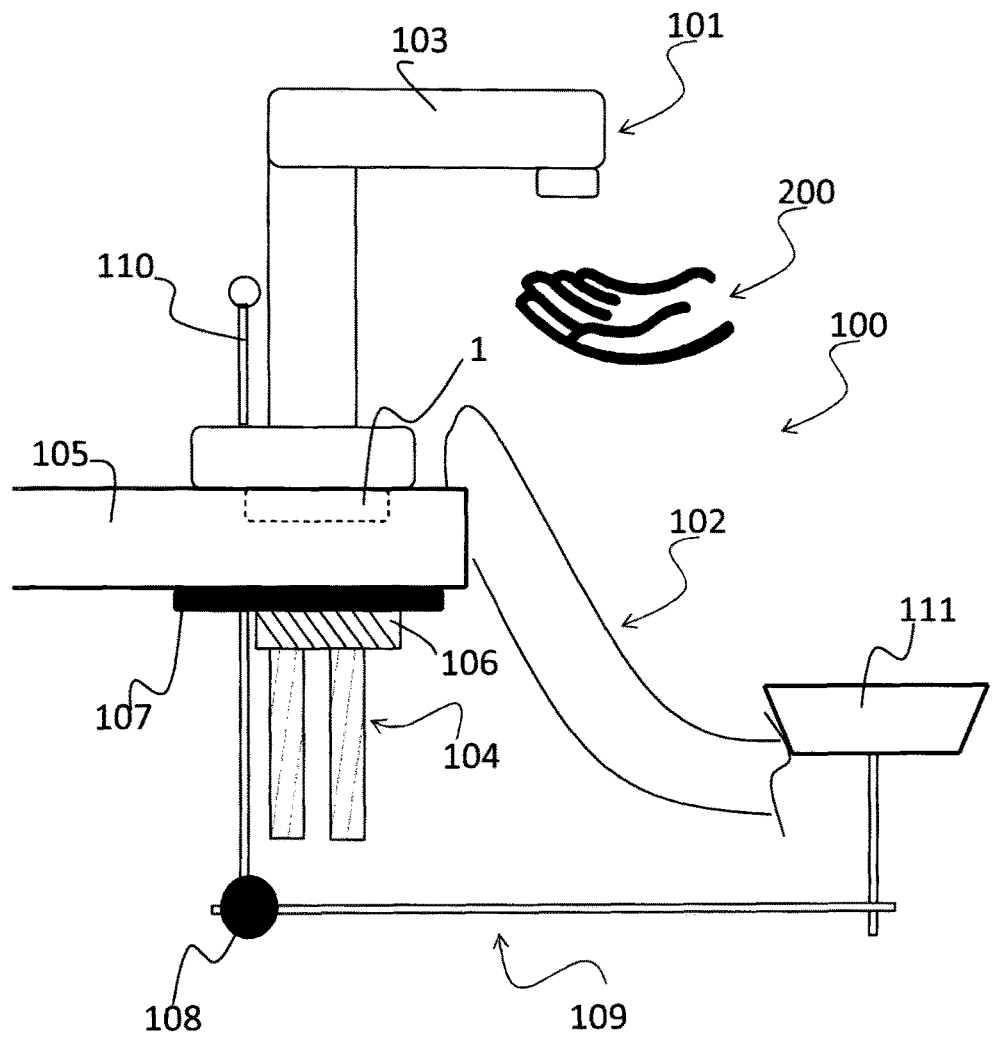
FIG. 5 is an automatic faucet incorporating the sensor of FIG. 1.

FIG. 5 shows a sink 100 comprising a faucet 101 and a basin 102, of which only a section is shown.

The faucet 101 comprises a spout 103, the water coming from two pipes 104 carrying hot and cold water flows therethrough. The spout 103 of the faucet is installed on a surface 105 by means of one or more fastening elements. In the example of FIG. 5 the fastening element is a ring nut 106 placed on the fastening surface, however, depending on the faucet model, it is possible for the ring nut to be placed underneath the surface or two ring nuts to be provided, one above and one underneath the surface 105.

In the example of FIG. 5 the faucet comprises a sensor 1 of the type shown above with reference to FIGS. 1-4. The sensor 1, denoted by a broken line, is inserted within a recess in the surface 105 and the electrode 3 is placed in contact with the metal spout 103 of the faucet 101. Thus, the whole spout is part of the sensor and the faucet reacts to the hand 200 approaching or not the spout 103.

In order to insulate the sensor from the external environment insulators are provided, that is devices made of non-conductive material allowing the faucet to be insulated from the external environment.

In the example of FIG. 5 for example an insulator 107 is provided placed between the fastening ring nut 106 and the surface 105 and an insulator 108 is provided placed along the linkage 109 that allows the stopper 111 of the sink 100 to be controlled by means of the handle 110. In one embodiment, the insulator 108 takes the form of a plastic rubber washer or an O-ring, however other forms and solutions can be taken. If the electrode 3 is not put in contact with the faucet spout, but it is installed within the spout (for example into a suitable seat) insulated from the spout, then the insulators 107 and 108 may be omitted.

Anyway, it is necessary for the pipes 104 that carry hot and cold water to be made of non-conductive material, such to guarantee the electrical insulation from the water supplying system, it could conduct signals that would make the sensor less sensitive. The sensor 1 detects the interaction of the user with the faucet, for example if the hand 200 of a person moves near, if it touches or if it moves away from the faucet 101.

As better explained with reference to the figures below, the sensor can be configured for implementing different methods controlling the faucet, for example it can be configured such to detect only the presence of one person, without the need of touching it, or to detect the touch, or still to detect both the touch and a person moving near the faucet.

The inductor 4 connecting the pulse generator to the electrode 3 is a real inductor, and as such it has also capacitive and reactive components, such that the inductor acts as a mainly inductive circuit, having a gain that has maximum peaks at one resonance frequency $f_0$ and at frequencies distant $f_0/8$ (increase or decrease) of the resonance frequency. For example if considering the inductor NL565050T-472J-PF by TDK®, it has a maximum gain at a frequency of 252 kHz and gain peaks at 282.5 kHz, 315 kHz, 346.5 kHz and so on.

Figure 6:
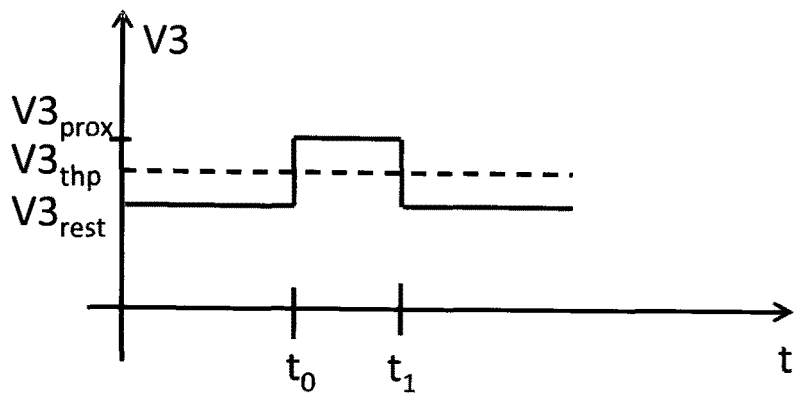
FIG. 6 is the change in a voltage of the sensor of FIG. 1, when operating as a proximity sensor, with a person interacting and not interacting with the faucet.
Figure 7:
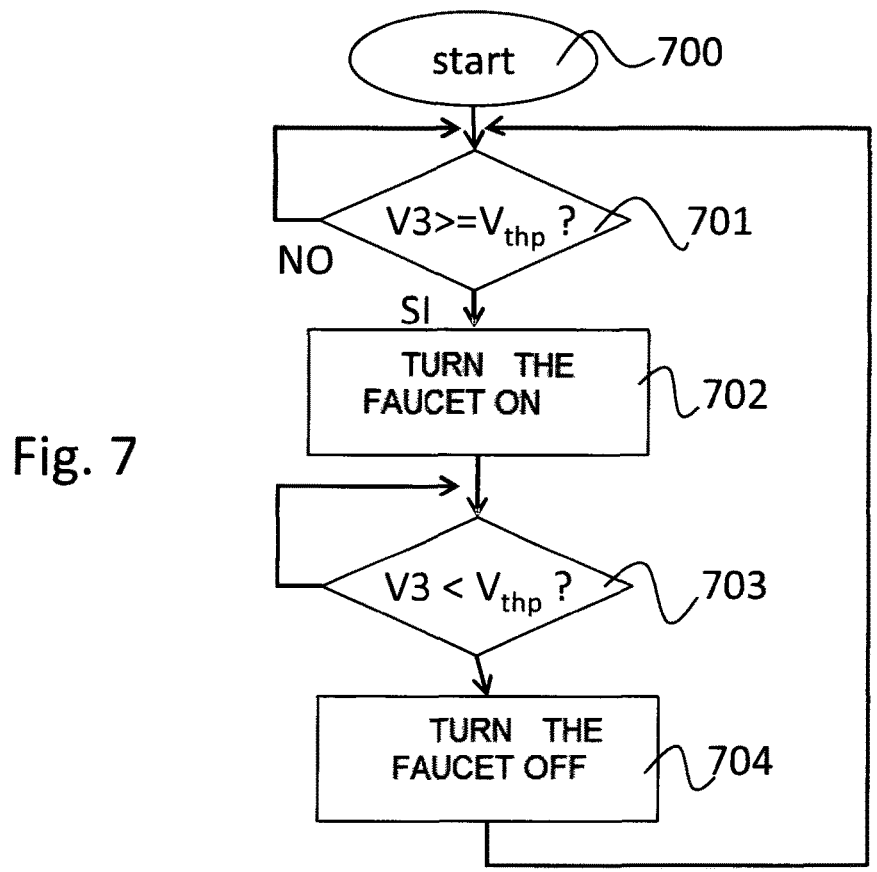
FIG. 7 is a method for controlling an automatic faucet with the sensor of FIG. 1 when configured for operating as a proximity sensor.

FIG. 6 shows the trend of the voltage V3 in the case if the pulse generator 2 is set for generating a pulse train with a frequency lower than the resonance frequency $f_0$ or than an octave thereof ($nf_0/8$ with n being an integer). In this case, the sensor 1 detects one hand approaching the electrode, namely it acts as a pure proximity sensor. The automatic faucet therefore can be configured for implementing the method of FIG. 7. The control system of the faucet (for example the unit 62 in FIG. 1) checks (step 701) whether the voltage V3 overcomes a threshold value sets in $V_{thp}$ such that $V_{rest}<=V_{thp}$. If the voltage is lower than the threshold value (preferably selected higher than $V3_{rest}$ such to consider possible noises), then this means that there is no interaction between a person and the faucet and the method returns to step 701. When (time $t_0$ of FIG. 6) a person moves near the electrode (or the spout of the faucet if the electrode is connected thereto), then the voltage V3 increases by passing from the rest value $V3_{rest}$ to the detection value $V3_{prox}>V_{thp}$; therefore the control system checks that the measured voltage is higher than the threshold value and it turns the faucet on (step 702).

Then the control system starts to check (step 703) whether the measured voltage has dropped below the threshold value, that is whether $V3<V_{thp}$. If not, then the check is repeated, otherwise it means that the interaction with the faucet has ended (time $t_1$), for example because the user brings his/her hands far away from the faucet, then the voltage V3 goes back to the rest value $V3_{rest}$. Now, the control system turns the faucet off (step 704) and the algorithm of the control system returns to step 701, waiting for turning again the faucet on.

Figure 8:
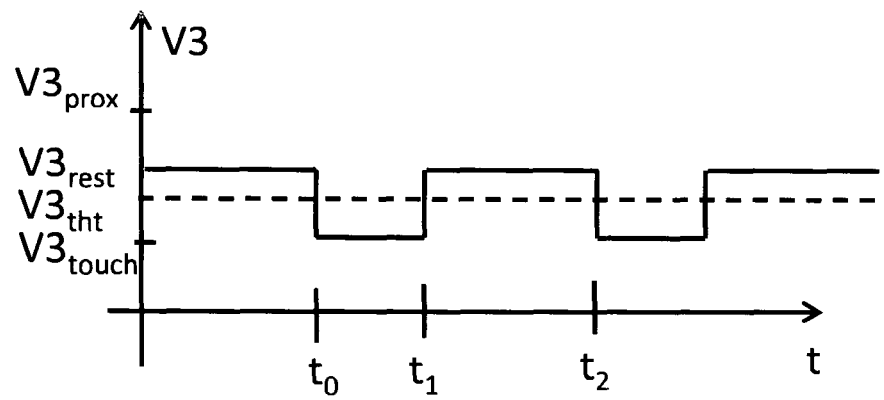
FIG. 8 is the change in a voltage of the sensor of FIG. 1, when operating as a touch sensor, with a person interacting and not interacting with the faucet.

FIG. 8 shows the trend of voltage V3 in the case if the pulse generator 2 is set to generate a pulse train with a frequency higher than the resonance frequency $f_0$ or than an octave thereof ($nf_0/8$ with n being an integer). In this case, the sensor 1 detects the touch of one hand with the faucet, namely it acts as a pure touch sensor. Therefore the automatic faucet can be set for implementing the method of FIG. 9. The control system of the faucet (for example unit 62 of FIG. 1) checks (step 901) whether the faucet is turned on, for example by controlling a flag in a memory field. If the faucet is turned off, then the control system checks (step 902) whether the voltage V3 goes below a threshold value sets in $V_{tht}$ such that $Vrest<=V_{tht}$. If the voltage is higher than the threshold value, then it means that there is no interaction between a person and the faucet and the method returns to step 902. When (time $t_0$ of FIG. 8) a person touches the electrode (or the faucet spout if the electrode is connected thereto) by the hand, then the voltage V3 decreases by passing from the rest value $V3_{rest}$ to the detection value $V3_{touch}<V_{tht}$; therefore the control system checks whether the measured voltage is lower than the threshold one, which corresponds the faucet being touched. In order to check whether the touch is intentional, and not accidental, (for example because one desires to clean the faucet), the control system is set for waiting for a predetermined quite short time $\Delta t$, for example 1 or 2 seconds (step 903) and then it repeats the check on the voltage value (step 904). If even in this case the voltage is lower than the threshold one, then the control system checks that the electrode has been intentionally touched and it turns the faucet on (step 905).

Then, when the person removes the hand from the contact with the electrode (time $t_1$ of FIG. 8), the voltage V3 rises above the threshold $V_{tht}$ and it returns to the initial value $V3_{rest}$. This is checked by the control system that, after turning the faucet on, and after waiting for a time $\Delta t2$ (e.g. 5 seconds) (step 906), it checks (step 907) whether the measured voltage has risen above the threshold value, namely if $V3>V_{tht}$. If yes, it means that there are no irregular situations, such as an unintentional extended contact of the hand with the faucet or a contact with an object that brings the electrode to ground; the algorithm therefore returns to step 901. If not, an operating abnormal condition is verified and the control system turns the faucet off (step 908).

Figure 9:
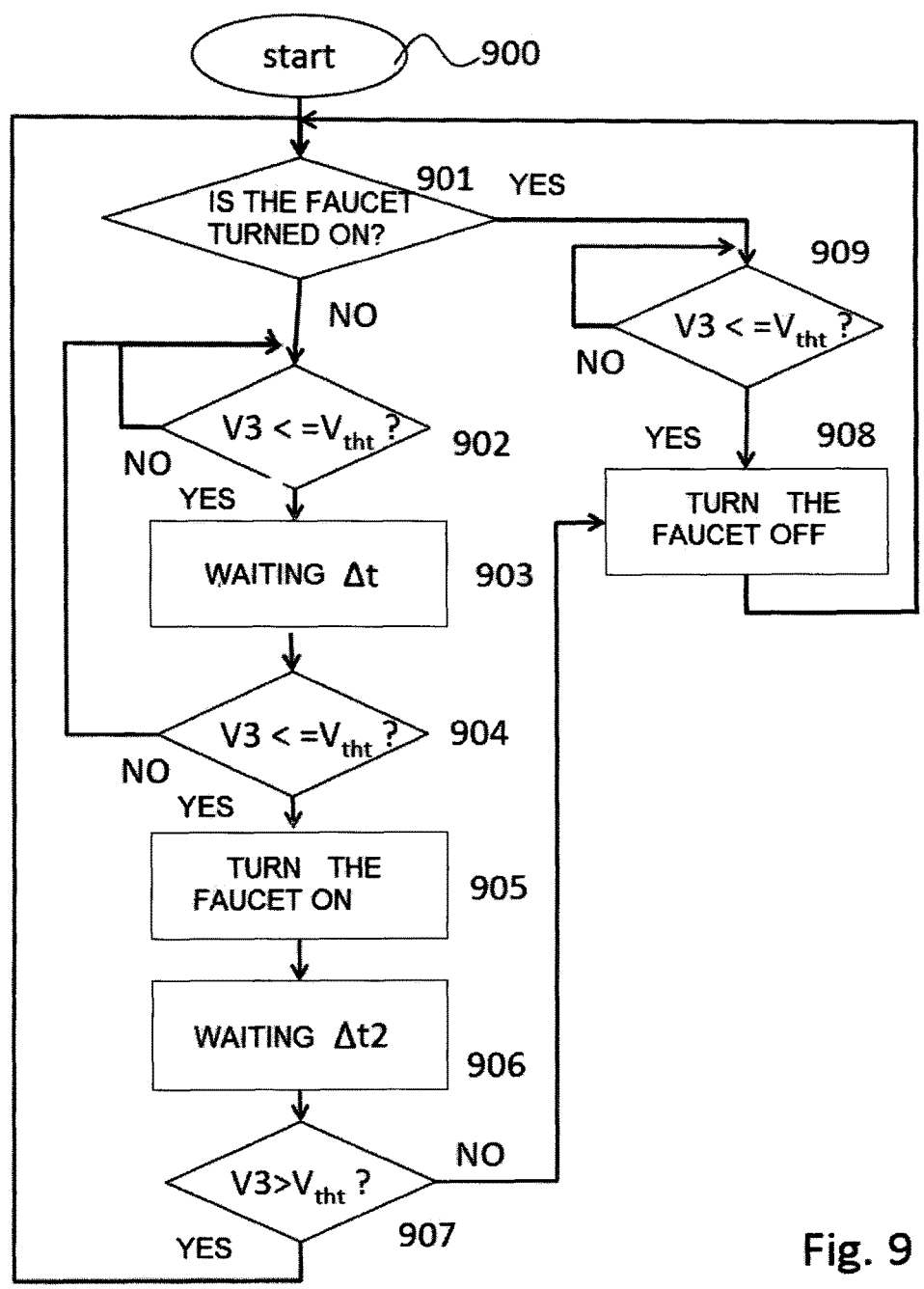
FIG. 9 is a method for controlling an automatic faucet with the sensor of FIG. 1 when configured for operating as a touch sensor.

When the faucet is turned on, in the example of FIG. 9 the water is supplied up to a time t2, when a new touch of the electrode by the user has occurred. This event is checked at step 909, where the control system checks whether there is a new contact with the electrode, that is if $V3<=V_{tht}$, in this case it turns the faucet off (step 908).

As an alternative, the control system can be configured such to supply water for a predetermined time, in this case the step 909 described above can be replaced by a timer, when it expires the faucet is turned off (step 909).

Figure 10:
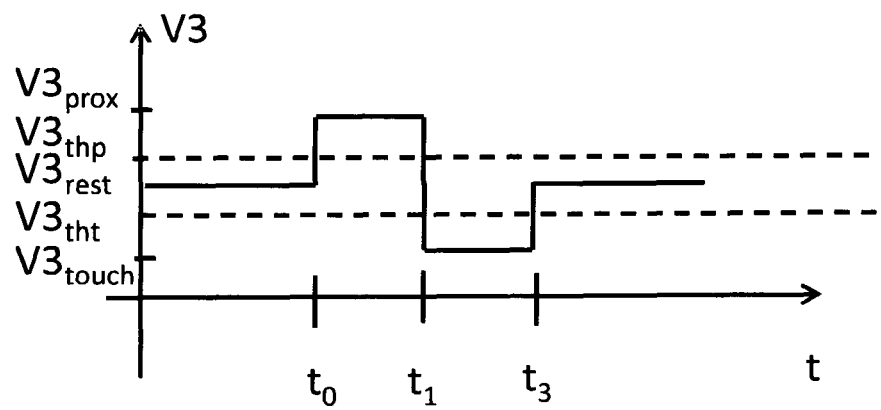
FIG. 10 is the change in a voltage of the sensor of FIG. 1, when operating as a mixed proximity and touch sensor, with a person interacting and not interacting with the faucet.

On the contrary the example of FIG. 10 shows the trend of the voltage V3 if the pulse generator 2 is set for generating a pulse train with a frequency equal to the resonance frequency $f_0$ or of an octave thereof ($nf_0/8$ with n being an integer). In this case, the sensor 1 detects both the proximity and the contact of one hand with the electrode, namely it acts as a mixed proximity and touch sensor.

Such as shown in FIG. 10, when the hand approaches the electrode, then the voltage V3 rises above the rest value $V_{rest}$ maintained in conditions of absence of an interaction between a person and the electrode. Therefore the behavior is similar to what explained with reference to FIG. 6. When a person touches with his/her hand the electrode, then the voltage V3 drops below $V_{rest}$, as mentioned above with reference to FIG. 8.

In this case, the control system 62 can be configured such to take different decisions depending on the fact that one hand touches or only moves near the electrode.

For example in a multi-way faucet, the control system may turn on and off the water flow of one way when the hand moves near or away from the electrode, and on the contrary it may turn on and off the water flow of another way when the hand touches the contact. In a faucet for a shower, this for example would allow the water flow of the shower to be turned on when the person goes near the sensor, and the water flow to be deviated from the shower head to the hand-held shower head when the electrode is touched.

In the light of the above, it is clear how the described sensor is able to achieve the suggested objects, and to allow, depending on its configuration, a proximity and a touch condition, or both of them, to be detected.

Therefore it is clear that the person skilled in the art can make different changes to the sensors and to the methods for controlling automatic faucets described above, without for this reason departing from the scope of protection of the present patent, such as defined in the annexed claims.

For example it is clear that several components described above as discrete components can be integrated or that different functional blocks of the circuit can be implemented by an integrated circuit or a programmable logic (PLC).

As regards the threshold values $V_{tht}$ and $V_{thp}$, they can be prearranged or can be defined after a calibration step after which the value of the voltage V3 is checked with a person in the condition interacting or not interacting with the faucet. Therefore the threshold voltage can be selected between two values of the voltage V3 measured during the calibration step, particularly, $\Delta V3$ being the difference between the measured signals, the threshold voltage is selected as equal to the voltage under non-interaction conditions ($V3_{rest}$) plus or minus (depending it is $V_{thp}$ or $V_{tht}$ respectively) 30-35% of $\Delta V3$. Therefore this calibration step allows an optimal threshold voltage to be selected that considers possible manufacturing tolerances of the sensor components.

In a further advantageous embodiment, the system uses a mobile threshold in order to distinguish between a condition of interaction and a condition of non-interaction with the faucet.

Depending on the configuration with which the sensor is installed in the faucet, for example whether the electrode is connected to the faucet spout or not, and depending on the salt level of the water flowing through the faucet, the voltage V3 used by the control system to decide how controlling the faucet, in absence of an interaction, may considerably be different in case the faucet is turned on or off, namely in presence of water flowing or not through the faucet spout.

The use of a mobile threshold allows a good ability of the sensor to be kept for distinguishing between a user interacting or not interacting with the sensor with the faucet in the turned on or off conditions.

Figure 11:
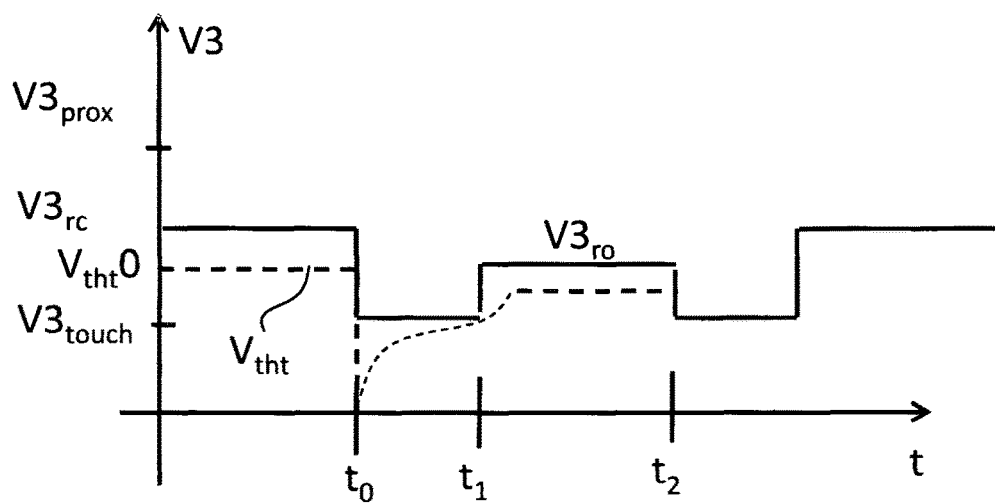
FIG. 11 is the change in a voltage of the sensor of FIG. 1, when operating as a touch sensor, with a person interacting and not interacting with the faucet.

In the example of FIG. 11 a sensor 1 is considered configured for operating as a pure touch sensor.

With reference to FIG. 11, at time zero the faucet is turned off and there is no interaction between the faucet and the physical person, therefore the voltage V3 is at the rest value $V3_{rc}$. The threshold voltage $V_{tht}$, in this initial step is set at the value $V_{tht}0$, for example determined after a calibration step as described above.

At time to the voltage V3 drops below the threshold value $V_{tht}$, set in $V_{tht}0$, going to $V3_{touch}$. Such as described with reference to the method of FIG. 12, the system controlling the faucet detects that a touch has occurred (step 1001), it checks that the faucet is turned off (step 1002) and it turns it on (step 1003).

Now (time t0), the threshold voltage is set to zero $V_{tht}$ (step 1004) and the control system waits for detecting a new touch (step 1001).

At the following clock moments, the control system calculates again the value of the threshold voltage keeping it always below the signal value V3.

In one embodiment the threshold voltage is calculated as:

$$V_{tht} = V3 * 0.65$$

Since the threshold is always kept below the value of the signal V3, the faucet control method can be simplified with respect to the example of FIG. 9.

When at time t1 the touch between the hand of a person and the sensor ends, the voltage V3 increases to value V3ro, lower than V3rc due to the water passing through the faucet, however the threshold remains below the value of V3, therefore the sensor control system does not carry out any actions on the faucet.

When at time t2 the sensor detects a new touch, the sensor control system checks that a touch has occurred and that the faucet is turned on, therefore it turns it off (step 1005) and it goes back to a standby condition waiting for a new touch (step 1001).

Figure 12:
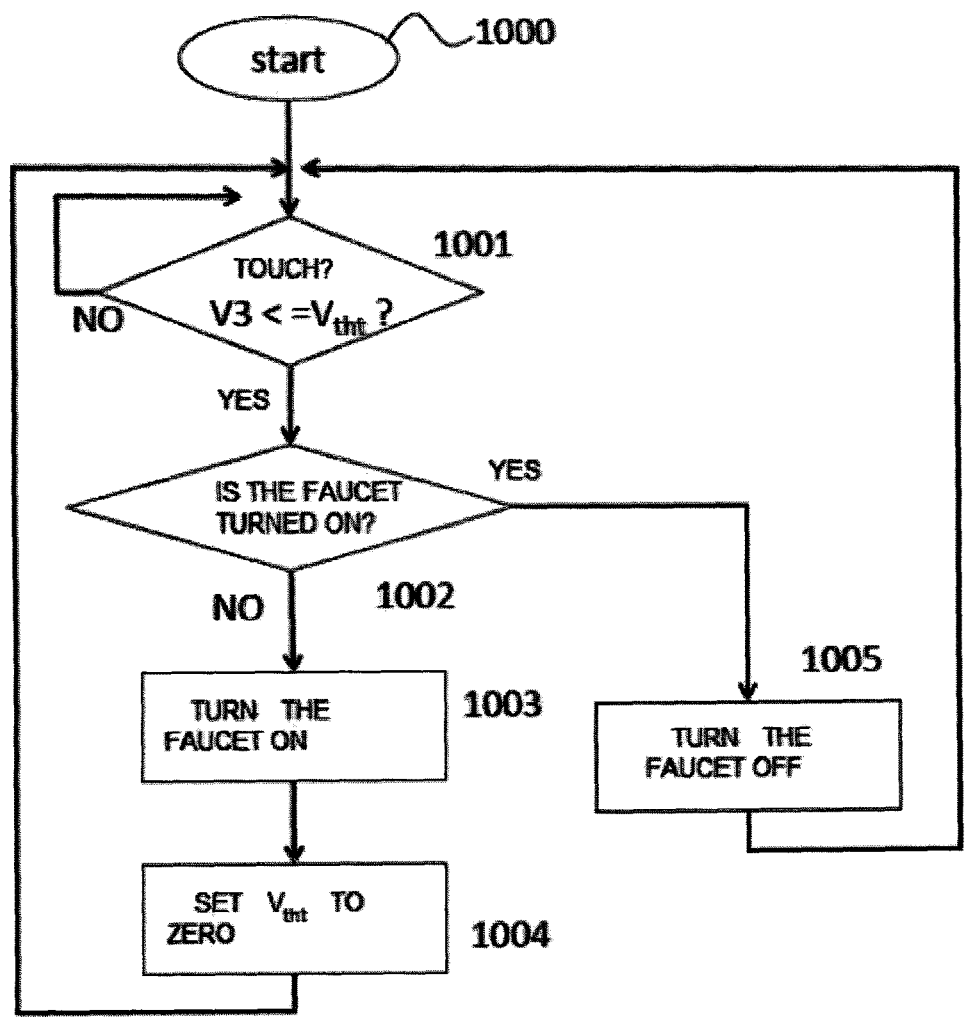
FIG. 12 is a second method for controlling an automatic faucet with the sensor of FIG. 1, when configured for operating as a touch sensor.

Even if referred to a sensor configured to operate as a touch sensor, the example of FIGS. 11 and 12 however is not limitative and the use of the mobile threshold may be made, with suitable precautions, also for sensors configured as proximity sensors or mixed proximity and touch sensors. For example, when the sensor has to operate as a proximity sensor, the mobile threshold will be kept higher than the signal V3 (e.g. $V_{th} = V3 * 1.35$) and not lower as described for the example of FIGS. 11 and 12.

In the case of sensors operating as mixed sensors, therefore with the pulse generator set for generating a pulse train with a repetition rate equal to the resonance frequency or to a multiple of an octave of such frequency, two mobile thresholds are used: a mobile threshold is kept lower than the signal V3, the other one higher than such signal. By monitoring when the signal V3 crosses one threshold or the other one, it is possible to decide how to control valves, devices or appliances (electric or hydraulic ones).

In one embodiment, the control unit 62 detects not only the change in the voltage of the electrode, but it measures also a differential intensity vector between the signal and a threshold (a mobile threshold or not depending on the configurations). In this embodiment therefore the sensor is able to generate an output V4 variable as a function of such differential intensity vector. Since such differential intensity vector depends (in case of a proximity detection) on the distance of one person from the sensor, this allows the flexibility of use of the sensor to be further enhanced, it may be configured for controlling the flow rate, the mixing temperature or the selection of the supply depending on the distance of the person from the sensor. For example the sensor may be set to increase the water flow rate when the hand of a person moves near the sensor and to reduce it when the hand moves away therefrom.

Figure 13:
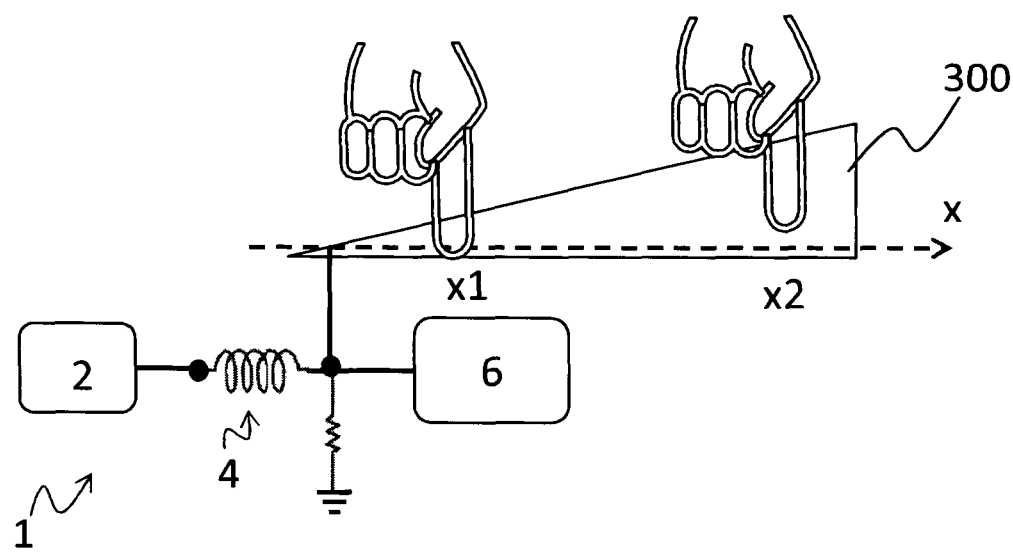
FIGS. 13 and 14 are further embodiments of a sensor alternative to those of FIG. 1.

In one embodiment that uses the differential intensity vector, the electrode of the sensor is made as a metal plate with a triangular shape as shown in FIG. 13. Therefore the electrode has a detection surface 300 that increases as moving towards x. By touching (or moving near to) the electrode in different positions, there is a different area of interaction between the electrode and the finger, and consequently, the differential intensity vector is different. For example is considering FIG. 13, the area of interaction of the finger at position x1 is smaller than the one at position x2. Therefore this solution allows a kind of sliding contact (slider) to be made, therefore by moving the finger (touching or not) along the electrode in the direction x, the sensor detects a continuous change in the differential intensity vector, which will be increasing or decreasing depending on the direction of movement. Therefore the control unit 62 is configured for controlling a device or an appliance downstream of the sensor depending on the change of the differential intensity vector, for example for increasing the flow rate or the temperature of a water flow in a faucet depending on the movement of the finger along the electrode.

Figure 14:
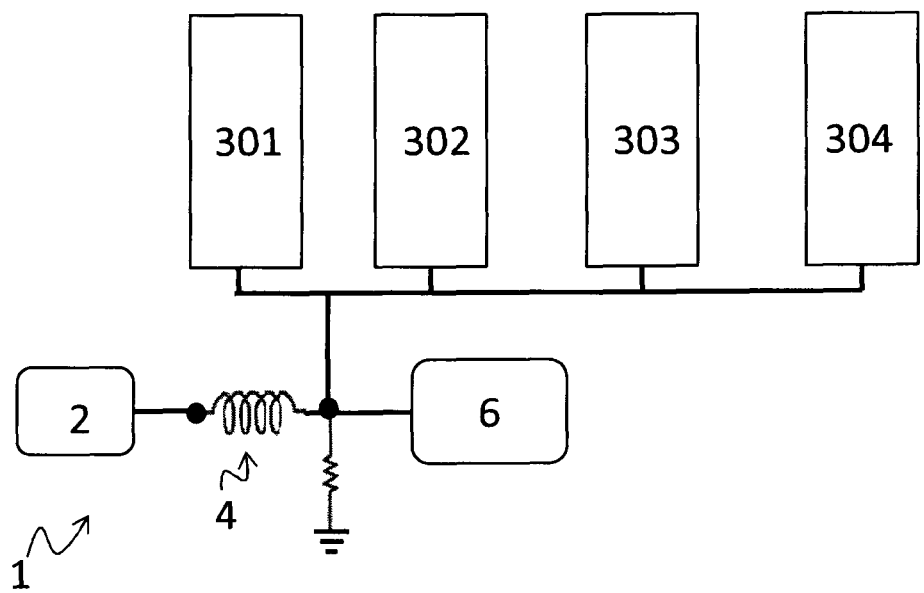

As an alternative to a shape offering variable detection surfaces, such as shown in FIG. 13, in the example of FIG. 14, the electrode 3 is composed of several separated detection areas, denoted by the references 301, 302, 303 and 304. By touching one or more of the areas 301-304 the differential intensity vector changes, and therefore the sensor can control in a different manner a device or an appliance downstream of the sensor, for example, presuming that the sensor is configured for operating as a touch sensor, if the areas 301 and 302 are touched the water flow rate is adjusted, if areas 303 and 304 are touched the water temperature is adjusted. In this embodiment, therefore, the sensor has an electrode with different detection surfaces and it is configured for controlling a device in a manner depending on the interaction of one person with one or more of said detection areas.

It has to be noted that, although the several embodiments have been disclosed above with reference to the application in the field of automatic faucets, the sensor described above may be applied in many other fields, such as for example the field of user interfaces or the security field, therefore the sensor can control electric appliances, such as alarms or signal transmitters, or it can be used for detecting the interaction of a person with an area of a device.

The invention claimed is:

1. An automatic faucet comprising
a metal spout and
a detection sensor,
wherein the detection sensor comprises:
a pulse generator,
an electrode connected at one end to an output of the pulse generator via an inductive circuit and to the metal spout at the other end,
a detector adapted to detect a change in the amplitude of the signal being present at the electrode, and
a control unit operatively connected to the output of the detector and adapted to detect the presence of a person interacting with the sensor based on the detector output signal.

2. The faucet of claim 1, further comprising a valve and wherein the control unit is configured to generate an output control signal to control the valve.

3. The faucet of claim 1, wherein the pulse generator is adapted to generate a pulse train with repetition rate equal to the resonance frequency of the inductive circuit or to an integer multiple of an octave of said resonance frequency.

4. The faucet of claim 1, wherein the control unit is adapted to compare the detector output signal with a threshold signal and to output a control signal depending on such a comparison.

5. The faucet of claim 4, wherein the control unit is configured to automatically change in time the threshold signal, and in particular it is configured to keep said threshold signal always below or always above the detector output signal.

6. The faucet of claim 5, wherein the pulse generator is adapted to generate a pulse train with a repetition rate substantially equal to the resonance frequency of the inductive circuit or to an integer multiple of an octave of said resonance frequency, and wherein the control unit is configured to compare the detector output signal with two threshold signals variable in time, a first one of said two threshold signals being kept always below the detector output, and a second one of said two threshold signals being kept always above the detector output.

7. The faucet of claim 6, wherein the control unit is adapted to determine an initial value of the threshold signal based on a calibration phase wherein the value of the detector output voltage is detected in both condition of interaction and non-interaction of a person with the sensor.

8. The faucet of claim 5, wherein the control unit is adapted to determine an initial value of the threshold signal based on a calibration phase wherein the value of the detector output voltage is detected in both condition of interaction and non-interaction of a person with the sensor.

9. The faucet of claim 5, wherein the control unit is adapted to determine an initial value of the threshold signal based on a calibration phase wherein the value of the detector output voltage is detected in both condition of interaction and non-interaction of a person with the sensor.

10. The faucet of claim 1, wherein the electrode has an interaction surface which increases along a main direction, and wherein the control unit is adapted to generate a control signal which depends on the movement of a finger along said main direction.

11. The faucet of claim 1, wherein the electrode has a plurality of interaction surfaces separated from each other, and wherein the control unit is adapted to generate a control signal which depends on the interaction surface or surfaces with which a person interacts.

* * * * *